(12) United States Patent
Masuda et al.

(10) Patent No.: US 8,999,854 B2
(45) Date of Patent: Apr. 7, 2015

(54) METHOD FOR MANUFACTURING SILICON CARBIDE SEMICONDUCTOR DEVICE

(71) Applicants: Sumitomo Electric Industries, Ltd., Osaka-shi (JP); National University Corporation Nara Institute of Science and Technology, Ikoma-shi (JP)

(72) Inventors: Takeyoshi Masuda, Osaka (JP); Tomoaki Hatayama, Ikoma (JP)

(73) Assignees: Sumitomo Electric Industries, Ltd., Osaka-shi (JP); National University Corporation Nara Institute of Science and Technology, Ikoma-shi (JP)

( * ) Notice: Subject to any disclaimer, the term of this patent is extended or adjusted under 35 U.S.C. 154(b) by 0 days.

(21) Appl. No.: 13/658,583

(22) Filed: Oct. 23, 2012

(65) Prior Publication Data

US 2013/0130482 A1    May 23, 2013

Related U.S. Application Data

(60) Provisional application No. 61/562,092, filed on Nov. 21, 2011.

(30) Foreign Application Priority Data

Nov. 21, 2011    (JP) .................. 2011-253614

(51) Int. Cl.
*H01L 21/302* (2006.01)
*H01L 29/861* (2006.01)
(Continued)

(52) U.S. Cl.
CPC ............ *H01L 29/8613* (2013.01); *H01L 29/78* (2013.01); *H01L 21/02576* (2013.01); *H01L 29/0615* (2013.01); *H01L 29/868* (2013.01); *H01L 29/739* (2013.01); *H01L 21/0262* (2013.01); *H01L 29/06* (2013.01);
(Continued)

(58) Field of Classification Search
USPC .................... 438/786, 931, 73, 735
See application file for complete search history.

(56) References Cited

U.S. PATENT DOCUMENTS

| | | |
|---|---|---|
| 5,744,826 A | 4/1998 | Takeuchi et al. |
| 5,976,936 A | 11/1999 | Miyajima et al. |

(Continued)

FOREIGN PATENT DOCUMENTS

| | | |
|---|---|---|
| CN | 101542739 A | 9/2009 |
| EP | 1612851 A1 | 1/2006 |

(Continued)

OTHER PUBLICATIONS

Office Action issued in U.S. Appl. No. 13/805,279 dated Mar. 24, 2014.

(Continued)

*Primary Examiner* — Bradley K Smith
(74) *Attorney, Agent, or Firm* — Venable LLP; Michael A. Sartori; Tamatane J. Aga

(57) ABSTRACT

On a substrate, a silicon carbide layer provided with a main surface is formed. A mask is formed to cover a portion of the main surface of the silicon carbide layer. The main surface of the silicon carbide layer on which the mask is formed is thermally etched using chlorine-based gas so as to provide the silicon carbide layer with a side surface inclined relative to the main surface. The step of thermally etching is performed in an atmosphere in which the chlorine-based gas has a partial pressure of 50% or smaller.

10 Claims, 9 Drawing Sheets

(51) Int. Cl.

| | | |
|---|---|---|
| *H01L 29/78* | (2006.01) | |
| *H01L 29/06* | (2006.01) | |
| *H01L 29/868* | (2006.01) | |
| *H01L 29/739* | (2006.01) | |
| *H01L 21/308* | (2006.01) | |
| *H01L 21/3065* | (2006.01) | |
| *H01L 29/12* | (2006.01) | |
| *H01L 21/02* | (2006.01) | |
| *H01L 29/16* | (2006.01) | |

(52) U.S. Cl.
CPC ....... *H01L21/3083* (2013.01); *H01L 21/02529* (2013.01); *H01L 29/1608* (2013.01); *H01L 29/861* (2013.01); *H01L 29/0619* (2013.01); *H01L 21/3065* (2013.01); *H01L 29/12* (2013.01); *Y10S 438/931* (2013.01)

(56) References Cited

U.S. PATENT DOCUMENTS

| | | |
|---|---|---|
| 6,020,600 A | 2/2000 | Miyajima et al. |
| 6,133,587 A | 10/2000 | Takeuchi et al. |
| 6,452,228 B1 | 9/2002 | Okuno et al. |
| 6,734,461 B1 | 5/2004 | Shiomi et al. |
| 2003/0012925 A1 | 1/2003 | Gorrell |
| 2003/0075765 A1 | 4/2003 | Ohnakado et al. |
| 2003/0137012 A1 | 7/2003 | Yamaguchi et al. |
| 2003/0227061 A1 | 12/2003 | Yokogawa et al. |
| 2006/0214268 A1 | 9/2006 | Maeyama et al. |
| 2006/0249073 A1 | 11/2006 | Asaoka et al. |
| 2007/0026632 A1 | 2/2007 | Yamamoto |
| 2007/0057262 A1 | 3/2007 | Nakamura et al. |
| 2007/0090370 A1 | 4/2007 | Nakayama et al. |
| 2007/0200116 A1 | 8/2007 | Harris et al. |
| 2007/0210316 A1 | 9/2007 | Yonezawa et al. |
| 2007/0267663 A1 | 11/2007 | Harada |
| 2008/0032880 A1 | 2/2008 | Maruyama et al. |
| 2008/0213536 A1 | 9/2008 | Maruyama et al. |
| 2008/0230787 A1 | 9/2008 | Suzuki et al. |
| 2009/0114982 A1 | 5/2009 | Saka et al. |
| 2009/0200559 A1 | 8/2009 | Suzuki et al. |
| 2010/0062582 A1 | 3/2010 | Fujikawa |
| 2010/0261333 A1 | 10/2010 | Nakayama et al. |
| 2010/0314626 A1 | 12/2010 | Harada et al. |
| 2011/0121316 A1 | 5/2011 | Harada |
| 2011/0175110 A1 | 7/2011 | Wada et al. |
| 2011/0201187 A1 | 8/2011 | Nishiwaki et al. |
| 2011/0233560 A1 | 9/2011 | Koike et al. |
| 2012/0161154 A1 | 6/2012 | Mimura et al. |
| 2012/0205670 A1 | 8/2012 | Kudou et al. |
| 2012/0228640 A1 | 9/2012 | Masuda et al. |
| 2012/0248461 A1* | 10/2012 | Masuda et al. .................. 257/77 |
| 2012/0309195 A1 | 12/2012 | Masuda |
| 2014/0203300 A1 | 7/2014 | Hatayama et al. |

FOREIGN PATENT DOCUMENTS

| | | |
|---|---|---|
| JP | 7-326755 | 12/1995 |
| JP | 08-070124 A | 3/1996 |
| JP | 9074191 A | 3/1997 |
| JP | 9-199724 | 7/1997 |
| JP | 2000-021849 A | 1/2000 |
| JP | 2001-002499 A | 1/2001 |
| JP | 2001-503726 | 3/2001 |
| JP | 2004-292305 A | 10/2004 |
| JP | 2005-056868 | 3/2005 |
| JP | 2005-223255 A | 8/2005 |
| JP | 2005-294872 A | 10/2005 |
| JP | 2005-328013 A | 11/2005 |
| JP | 2005-340685 | 12/2005 |
| JP | 2006-016288 A | 1/2006 |
| JP | 2006-228901 A | 8/2006 |
| JP | 2006-303469 A | 11/2006 |
| JP | 2007-035823 A | 2/2007 |
| JP | 2007-053227 A | 3/2007 |
| JP | 2007-080971 | 3/2007 |
| JP | 2007-165657 | 6/2007 |
| JP | 2007-182330 A | 7/2007 |
| JP | 2007-311627 A | 11/2007 |
| JP | 2008-135534 A | 6/2008 |
| JP | 2008-135653 | 6/2008 |
| JP | 2008-235546 | 10/2008 |
| JP | 2009-523324 A | 6/2009 |
| JP | 2009-170456 A | 7/2009 |
| JP | 2009-289987 A | 12/2009 |
| JP | 2010-040564 | 2/2010 |
| JP | 2010-062381 A | 3/2010 |
| JP | 2010-103326 A | 5/2010 |
| JP | 2010-147222 A | 7/2010 |
| JP | 2011-044513 A | 3/2011 |
| WO | WO-98/21386 A1 | 5/1998 |
| WO | WO-02/097852 A2 | 12/2002 |
| WO | WO-2005/116307 A1 | 12/2005 |
| WO | WO-2007/081964 A2 | 7/2007 |
| WO | WO-2011/048800 A1 | 4/2011 |
| WO | WO-2012/017796 A1 | 2/2012 |
| WO | WO-2013/031172 A1 | 7/2013 |

OTHER PUBLICATIONS

International Search Report and Written Opinion issued in PCT Patent Application No. PCT/JP2011/066096 dated Oct. 25, 2011.

Office Action issued in U.S. Appl. No. 13/579,815 dated Jun. 24, 2013.

Office Action issued in U.S. Appl. No. 13/579,815 dated Nov. 1, 2013.

Notice of Grounds of Rejection issued in Japanese Patent Application No. 2012-527720 dated Aug. 19, 2014.

International Search Report and Written Opinion issued in PCT Patent Application No. PCT/JP2011/067501 dated Nov. 8, 2011.

Office Action issued in U.S. Appl. No. 13/613,785 dated Dec. 6, 2013.

Yano et al., "SiO2/SiC Interface Properties on Various Surface Orientations," Mat. Res. Soc. Symp. Proc., vol. 742, pp. K4.5.1-K4.5.8.

International Search Report and Written Opinion issued in PCT Patent Application No. PCT/JP2012/070681 dated Nov. 20, 2012.

Office Action issued in U.S. Appl. No. 13/607,388 dated Dec. 24, 2013.

"Epitaxial Devices—Characteristics—Electronic Circuits and Diagram—Electronics Projects and Design," Jun. 11, 2010, accessed from the Internet on Aug. 26, 2013 from: http://www.circuitstoday.com/epitaxial-devices-characteristics.

"A Primer on Photodiode Technology," accessed from the Internet: http://home.sandiego.edu/~ekim/photodiode/pdtech.html.

"pn junction equilibrium graph," Wikipedia, 1 page.

International Search Report and Written Opinion issued in PCT Patent Application No. PCT/JP2012/070658 dated Nov. 27, 2012.

Office Action issued in U.S. Appl. No. 13/613,838 dated Sep. 16, 2013.

Office Action issued in U.S. Appl. No. 13/613,838 dated Mar. 3, 2014.

International Search Report and Written Opinion issued in PCT Patent Application No. PCT/JP2012/069790 dated Sep. 18, 2012.

International Search Report and Written Opinion issued in PCT Patent Application No. PCT/JP2012/075516 dated Nov. 27, 2012.

Office Action issued in U.S. Appl. No. 13/613,785 dated Mar. 20, 2014.

Notice of Grounds of Rejection issued in Japanese Patent Application No. 2011-200247 dated Nov. 18, 2014.

Takenami et al., "Sloped Sidewalls in 4H-SiC Mesa Structure Formed by a Cl2-O2 Thermal Etching," Materials Science Forums, vol. 556-557 (2007) pp. 733-736.

Notification of First Office Action issued in Chinese Patent Application No. 201180018742.1 dated Oct. 15, 2014.

(56) References Cited

OTHER PUBLICATIONS

Notice of Grounds of Rejection issued in Japanese Patent Application No. 2011-208679 dated Jan. 6, 2015.
Notice of Grounds of Rejection issued in Japanese Patent Application No. 2011-253614 dated Jan. 13, 2015.
Hatayama et al., "Evaluation of Crystallinity in 4H-SiC{0001} Epilayers Thermally Etched by Chlorine and Oxygen System," Japanese Journal of Applied Physics, vol. 45, No. 27, 2006, pp. L690-L693.
Extended European Search Report issued in European Patent Application No. 11814584.6 dated Jan. 21, 2015.

* cited by examiner

METHOD FOR MANUFACTURING SILICON CARBIDE SEMICONDUCTOR DEVICE

BACKGROUND OF THE INVENTION

1. Field of the Invention

The present invention relates to a method for manufacturing a silicon carbide semiconductor device, more particularly, a method for manufacturing a silicon carbide semiconductor device including a silicon carbide layer having an inclined side surface.

2. Description of the Background Art

Conventionally, it has been proposed to use silicon carbide (SiC) as a material for a semiconductor device. For example, it is proposed to use silicon carbide to form a trench gate type MOSFET (Metal Oxide Semiconductor Field Effect Transistor) (see Japanese Patent Laying-Open No. 2008-235546).

In this publication, it is proposed to form tapering side walls of a gate trench in order to improve breakdown voltage of a gate insulating film. Specifically, a semiconductor layer made of silicon carbide is partially removed by anisotropic etching using an etching mask having an opening pattern, and then is subjected to isotropic etching, whereby the gate trench formed in the semiconductor layer is provided with the tapering side walls.

When the side walls (side surfaces) of the gate trench are formed by means of isotropic etching as disclosed in this publication, it is difficult for each of the side surfaces to have a plane orientation sufficiently close to a specific crystal plane. If the side surface can be adapted to have a plane orientation close to such a specific crystal plane, various advantages can be obtained. For example, when a crystal plane allowing for high electron mobility is selected, a MOSFET having a low on-resistance can be obtained by increasing channel mobility.

SUMMARY OF THE INVENTION

The present invention has been made to solve the foregoing problem, and has its object to provide a method for manufacturing a silicon carbide semiconductor device including a silicon carbide layer having a side surface whose plane orientation can be made closer to a specific crystal plane.

A method for manufacturing a silicon carbide semiconductor device in one aspect of the present invention includes the following steps. A silicon carbide layer provided with a main surface is formed on a substrate. A mask is formed to cover a portion of the main surface of the silicon carbide layer. The main surface of the silicon carbide layer on which the mask is formed is thermally etched using chlorine-based gas so as to provide the silicon carbide layer with a side surface inclined relative to the main surface. The step of thermally etching is performed in an atmosphere in which the chlorine-based gas has a partial pressure of 50% or smaller.

According to the manufacturing method according to the above-described one aspect, the thermal etching is performed in the atmosphere in which the chlorine-based gas has a partial pressure of 50% or smaller. Accordingly, an amount of chlorine-based gas supplied to the surface to be etched is restricted. As a result, progress of etching is suppressed at a portion having high chemical stability, and etching of a portion having low chemical stability mainly proceeds. Accordingly, the plane orientation of the side surface formed in the silicon carbide layer by means of etching can be made closer to the specific crystal plane.

In the manufacturing method according to the above-described one aspect, the step of thermally etching is preferably performed in an atmosphere with reduced pressure. Accordingly, the amount of chlorine-based gas supplied to the surface to be etched is restricted. As a result, progress of etching is suppressed at the portion having high chemical stability, and etching of the portion having low chemical stability mainly proceeds. Accordingly, the plane orientation of the side surface formed in the silicon carbide layer by means of etching can be made closer to the specific crystal plane.

In the manufacturing method according to the above-described one aspect, the step of thermally etching is preferably performed at 1000° C. or greater. Accordingly, the surface to be etched is chemically activated, whereby an amount of consumption of chlorine-based gas in the etching becomes large at this surface. Hence, the amount of chlorine-based gas having an etching ability is restricted on the surface to be etched. As a result, progress of etching is suppressed at the portion having high chemical stability, and etching of the portion having low chemical stability mainly proceeds. Accordingly, the plane orientation of the side surface formed in the silicon carbide layer by means of etching can be made closer to the specific crystal plane.

A method for manufacturing a silicon carbide semiconductor device in another aspect of the present invention includes the following steps. A silicon carbide layer provided with a main surface is formed on a substrate. A mask is formed to cover a portion of the main surface of the silicon carbide layer. The main surface of the silicon carbide layer on which the mask is formed is thermally etched using chlorine-based gas so as to provide the silicon carbide layer with a side surface inclined relative to the main surface. The step of thermally etching is performed in an atmosphere with reduced pressure.

According to the manufacturing method according to the above-described another aspect, the thermal etching is performed in the atmosphere with reduced pressure. Accordingly, an amount of chlorine-based gas supplied to the surface to be etched is restricted. As a result, progress of etching is suppressed at a portion having high chemical stability, and etching of a portion having low chemical stability mainly proceeds. Accordingly, the plane orientation of the side surface formed in the silicon carbide layer by means of etching can be made closer to the specific crystal plane.

In the manufacturing method according to the above-described another aspect, the atmosphere with reduced pressure preferably has a pressure of not more than 1/10 of an atmospheric pressure. Accordingly, the amount of chlorine-based gas supplied to the surface to be etched is sufficiently restricted.

In the manufacturing method according to the above-described another aspect, the step of thermally etching is preferably performed in an atmosphere in which the chlorine-based gas has a partial pressure of 50% or smaller. Accordingly, the amount of chlorine-based gas supplied to the surface to be etched is restricted. As a result, progress of etching is suppressed at the portion having high chemical stability, and etching of the portion having low chemical stability mainly proceeds. Accordingly, the plane orientation of the side surface formed in the silicon carbide layer by means of etching can be made closer to the specific crystal plane.

In the manufacturing method according to the above-described another aspect, the step of thermally etching is preferably performed at 1000° C. or greater. Accordingly, the surface to be etched is chemically activated, whereby an amount of consumption of chlorine-based gas in the etching becomes large at this surface. Hence, the amount of chlorine-based gas having an etching ability is restricted on the surface to be etched. As a result, progress of etching is suppressed at the portion having high chemical stability, and etching of the portion having low chemical stability mainly proceeds. Accordingly, the plane orientation of the side surface formed in the silicon carbide layer by means of etching can be made closer to the specific crystal plane.

A method for manufacturing a silicon carbide semiconductor device in still another aspect of the present invention includes the following steps. A silicon carbide layer provided with a main surface is formed on a substrate. A mask is formed to cover a portion of the main surface of the silicon carbide layer. The main surface of the silicon carbide layer on which the mask is formed is thermally etched using chlorine-based gas so as to provide the silicon carbide layer with a side surface inclined relative to the main surface. The step of thermally etching is performed at 1000° C. or greater.

According to the manufacturing method according to the above-described still another aspect, the thermal etching is performed at 1000° C. or greater. Accordingly, the surface to be etched is chemically activated, whereby an amount of consumption of chlorine-based gas in the etching becomes large at this surface. Hence, the amount of chlorine-based gas having an etching ability is restricted on the surface to be etched. As a result, progress of etching is suppressed at a portion having high chemical stability, and etching of a portion having low chemical stability mainly proceeds. Accordingly, the plane orientation of the side surface formed in the silicon carbide layer by means of etching can be made closer to the specific crystal plane.

In the manufacturing method according to the above-described still another aspect, the step of thermally etching is preferably performed in an atmosphere in which the chlorine-based gas has a partial pressure of 50% or smaller. Accordingly, the amount of chlorine-based gas supplied to the surface to be etched is further restricted. As a result, progress of etching is suppressed at the portion having high chemical stability, and etching of the portion having low chemical stability mainly proceeds. Accordingly, the plane orientation of the side surface formed in the silicon carbide layer by means of etching can be made closer to the specific crystal plane.

In the manufacturing method according to the above-described still another aspect, the step of thermally etching is preferably performed in an atmosphere with reduced pressure. Accordingly, the amount of chlorine-based gas supplied to the surface to be etched is restricted. As a result, progress of etching is suppressed at the portion having high chemical stability, and etching of the portion having low chemical stability mainly proceeds. Accordingly, the plane orientation of the side surface formed in the silicon carbide layer by means of etching can be made closer to the specific crystal plane.

Preferably, the method for manufacturing the silicon carbide semiconductor device further includes the following steps. A gate insulating film is formed on the side surface of the silicon carbide layer. Then, a gate electrode is formed to face the side surface of the silicon carbide layer with the gate insulating film being interposed therebetween. In this way, the side surface having a plane orientation closer to the specific crystal plane can be used as a channel surface controlled by the gate electrode. Accordingly, variation of channel mobility can be suppressed. When the specific crystal plane is adapted to attain high channel mobility, high channel mobility can be obtained stably.

Preferably, the silicon carbide semiconductor device is a diode having a current path extending between the main surface of the silicon carbide layer and the substrate in a thickness direction of the silicon carbide layer. In this case, the side surface is located between the main surface side and the substrate side corresponding to ends of the diode. Hence, leakage current, which flows via the surface of the silicon carbide layer, flows on the side surface. When the side surface is adapted to have a plane orientation close to the specific crystal plane as described above, current is stably suppressed and is less likely to flow on the side surface. Accordingly, the leakage current of the diode can be stably suppressed to a low value. Further, when the specific crystal plane is adapted to attain a low interface state density, leakage current can be suppressed stably.

As described above, according to the present invention, the plane orientation of the side surface of the silicon carbide layer included in the silicon carbide semiconductor device can be made closer to the specific crystal plane.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
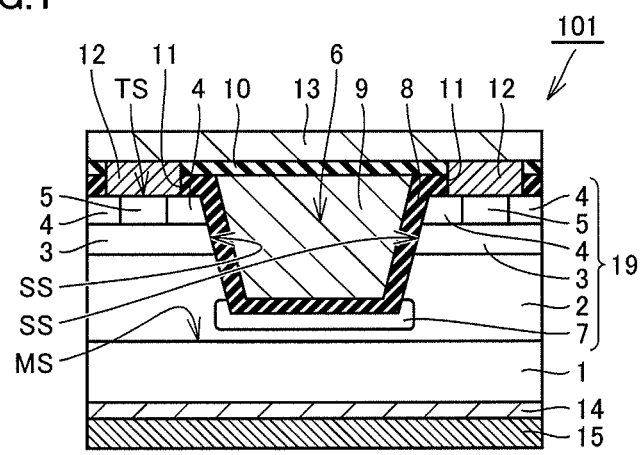
FIG. 1 is a partial cross sectional view schematically showing a configuration of a silicon carbide semiconductor device in a first embodiment of the present invention.

The following describes embodiments of the present invention with reference to figures. It should be noted that in the below-mentioned figures, the same or corresponding portions are given the same reference characters and are not described repeatedly. Further, regarding crystallographic indications in the present specification, an individual orientation is represented by [ ], a group orientation is represented by < >, and an individual plane is represented by ( ), and a group plane is represented by { }. In addition, a negative index is supposed to be crystallographically indicated by putting "-" (bar) above a numeral, but is indicated by putting the negative sign before the numeral in the present specification. For description of an angle, a system in which an omnidirectional angle is 360° is employed.

(First Embodiment)

Figure 2:
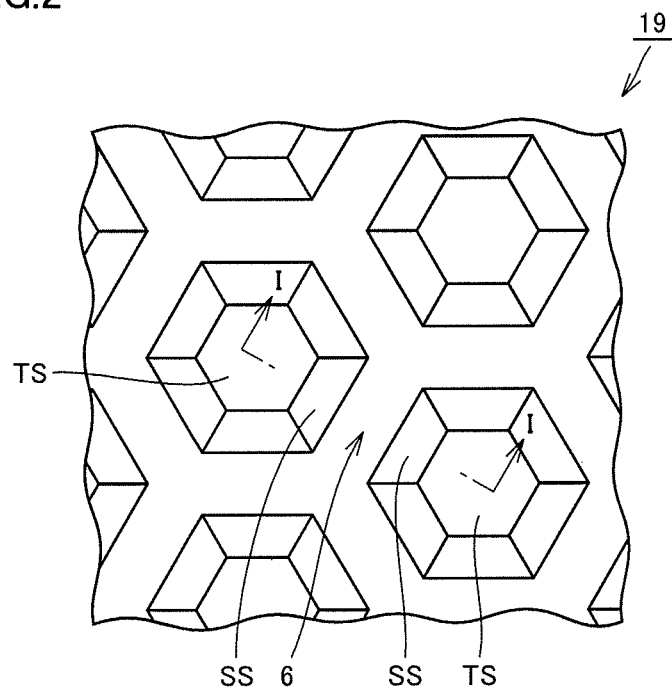
FIG. 2 is a partial plan view schematically showing a configuration of a silicon carbide layer provided in the silicon carbide semiconductor device of FIG. 1.

As shown in FIG. 1 and FIG. 2, a silicon carbide semiconductor device in the present embodiment is a vertical type MOSFET 101 having a trench gate. MOSFET 101 includes: a substrate 1 having n type conductivity; and a silicon carbide layer 19 epitaxially formed on a main surface MS of substrate 1. Silicon carbide layer 19 includes: a breakdown voltage holding layer 2 having n type conductivity; p type body layers 3; n type source contact layers 4; and contact regions 5 having p type conductivity.

Substrate 1 is made of silicon carbide having a single-crystal structure of one of hexagonal system and cubic system. Further, substrate 1 is provided with main surface MS having an off angle of 5° or smaller relative to a reference plane. In the case of the hexagonal system, the reference plane is a {000-1} plane, more preferably, a (000-1) plane. In the case of the cubic system, the reference plane is a {111} plane. Preferably, the off angle thereof is 0.5° or greater.

Silicon carbide layer 19 has a main surface TS substantially parallel to main surface MS of substrate 1. Trench 6 has side surfaces SS. Trench 6 has a tapering shape getting wider toward the opening. Hence, side surfaces SS are inclined relative to main surface TS. Each of side surfaces SS has a portion formed by p type body layer 3 and constituting a channel surface of MOSFET 101. Side surface SS has a specific crystal plane. Specifically, in the case of the hexagonal system, each of side surfaces SS substantially includes one of a {0-33-8} plane and a {01-1-4} plane. In the case of the cubic system, each of side surfaces SS substantially includes a {100} plane.

From a different point of view, the existence of trench 6 corresponds to existence of a mesa structure having main surface TS as a top surface. Preferably, this top surface has a hexagonal shape as shown in FIG. 2 in the case of the hexagonal system, and has a rectangle or square shape in the case of the cubic system.

Further, the semiconductor device includes gate insulating films 8, a gate electrode 9, interlayer insulating films 10, source electrodes 12, a source wire electrode 13, a drain electrode 14, and a backside surface protecting electrode 15.

The following describes details of the semiconductor device. Breakdown voltage holding layer 2 is formed on one main surface of substrate 1. Each of p type body layers 3 is formed on breakdown voltage holding layer 2. On p type body layer 3, n type source contact layers 4 are formed. P type contact region 5 is formed to be surrounded by n type source contact layers 4. By removing portions of n type source contact layers 4, p type body layer 3, and breakdown voltage holding layer 2, mesa structures surrounded by trench 6 are formed.

Gate insulating film 8 is formed on side surfaces SS and a bottom surface of trench 6. Gate insulating film 8 extends onto the upper surface of each of n type source contact layers 4. Gate electrode 9 is formed on gate insulating film 8 to fill the inside of trench 6 (i.e., fill the space between adjacent mesa structures). Gate electrode 9 has an upper surface substantially as high as the upper surface of a portion of gate insulating film 8 on the upper surface of each of n type source contact layers 4.

Interlayer insulating film 10 is formed to cover gate electrode 9 as well as the portion of gate insulating film 8 on the upper surface of each of n type source contact layers 4. By removing portions of interlayer insulating film 10 and gate insulating film 8, openings 11 are formed to expose portions of n type source contact layers 4 and p type contact regions 5. Source electrodes 12 are formed in contact with p type contact regions 5 and the portions of n type source contact layers 4 so as to fill the inside of openings 11. Source wire electrode 13 is formed in contact with the upper surface of each of source electrodes 12 so as to extend on the upper surface of interlayer insulating film 10. Further, drain electrode 14 is formed on the backside surface of substrate 1 opposite to its main surface on which breakdown voltage holding layer 2 is formed. This drain electrode 14 is an ohmic electrode. Drain electrode 14 has a surface which is opposite to its surface facing substrate 1 and on which backside surface protecting electrode 15 is formed.

When silicon carbide layer 19 has a hexagonal crystal structure, each of side surfaces SS (side walls of the mesa structure) of trench 6 substantially corresponds to a {0-33-8} plane. Specifically, the crystal plane constituting side surface SS is a plane having an off angle of not less than −3° and not more than 3°, more preferably, not less than −1° and not more than 1° relative to the {0-33-8} plane in the <1-100> direction. Because each of such side surfaces SS corresponds to the stable crystal plane, a higher channel mobility can be obtained when employed for the channel surface, as compared with a case where another crystal plane (for example, a (0001) plane) is employed therefor. In addition, leakage current is reduced and high breakdown voltage is obtained.

The following describes a method for manufacturing MOSFET 101.

Substrate 1 (FIG. 3) formed of silicon carbide is first prepared. In the case of the hexagonal system, main surface MS of substrate 1 substantially corresponds to a {000-1} plane. In the case of the cubic system, the main surface MS thereof substantially corresponds to a {111} plane.

Figure 3:
FIG. 3 is a partial cross sectional view schematically showing a first step of a method for manufacturing the silicon carbide semiconductor device of FIG. 1.

As shown in FIG. 3, on substrate 1, silicon carbide layer 19 provided with main surface TS is formed. Specifically, by means of epitaxial growth on main surface MS of substrate 1, silicon carbide layer 19 having n type conductivity is formed. This epitaxial growth can be performed using a CVD (Chemical Vapor Deposition) method that utilizes a mixed gas of silane ($SiH_4$) and propane ($C_3H_8$) as a material gas and utilizes hydrogen gas ($H_2$) as a carrier gas, for example. In doing so, it is preferable to introduce nitrogen (N) or phosphorus (P) as an impurity for providing silicon carbide layer 19 with n type conductivity, for example. The concentration of the impurity can be, for example, not less than $5 \times 10^{15}$ $cm^{-3}$ and not more than $5 \times 10^{16}$ $cm^{-3}$.

Figure 4:
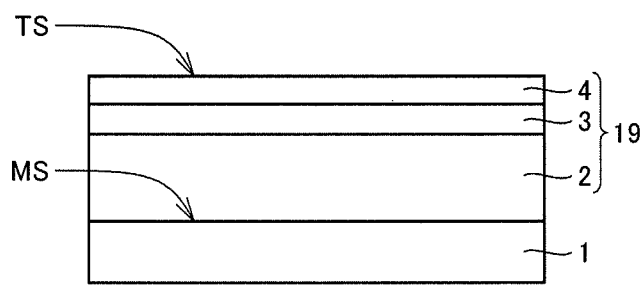
FIG. 4 is a partial cross sectional view schematically showing a second step of the method for manufacturing the silicon carbide semiconductor device of FIG. 1.

As shown in FIG. 4, breakdown voltage holding layer 2, p type body layer 3, and n type source contact layer 4 are formed from silicon carbide layer 19. Specifically, ions are implanted into the upper surface layer of silicon carbide layer 19, thereby forming p type body layer 3 and n type source contact layer 4. A portion thereof having not been through the ion implantation serves as breakdown voltage holding layer 2. In the ion implantation for forming p type body layer 3, ions of an impurity for providing p type conductivity such as aluminum (Al) are implanted. In doing so, by adjusting acceleration energy of the ions to be implanted, the depth of the region in which p type body layer 3 is to be formed can be adjusted. Further, ions of an impurity for providing n type conductivity are implanted into breakdown voltage holding layer 2 thus having p type body layer 3 formed therein, thereby forming n type source contact layer 4. An exemplary, usable impurity for providing n type conductivity is phosphorus (P) or the like.

Figure 5:
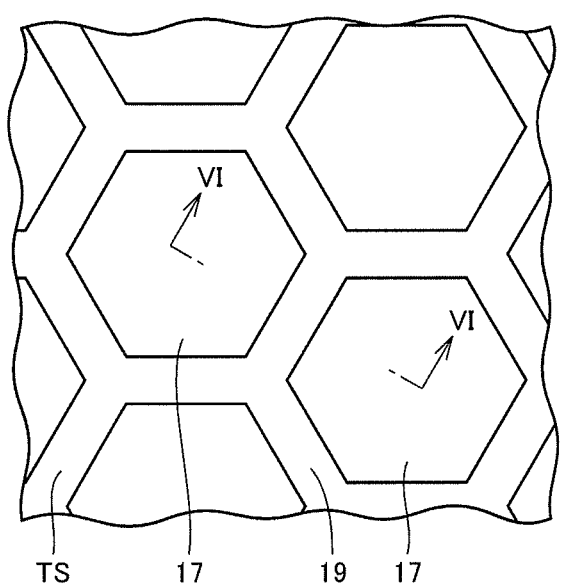
FIG. 5 is a partial plan view schematically showing a third step of the method for manufacturing the silicon carbide semiconductor device of FIG. 1.
Figure 6:
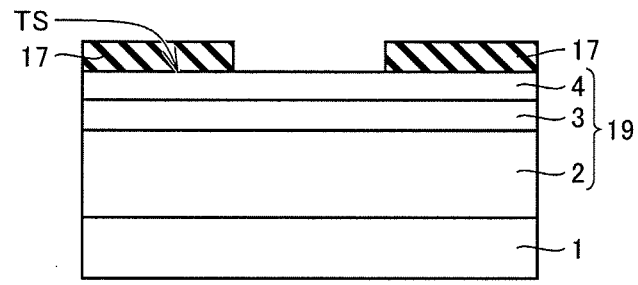
FIG. 6 is a partial cross sectional view schematically showing the third step of the method for manufacturing the silicon carbide semiconductor device of FIG. 1.

As shown in FIG. 5 and FIG. 6, masks 17 are formed to cover portions of main surface TS of silicon carbide layer 19. As each of masks 17, for example, an insulating film such as a silicon oxide film can be used. As a method for forming mask 17, the following process can be employed, for example. That is, a silicon oxide film is formed on the upper surface of n type source contact layer 4 by means of the CVD method or the like. Then, a resist film (not shown) having a predetermined opening pattern is formed on the silicon oxide film by means of the photolithography method. Using the resist film as a mask, a portion of the silicon oxide film is removed by etching. Thereafter, the resist film is removed. As a result, masks 17 having an opening pattern are formed.

Figure 7:
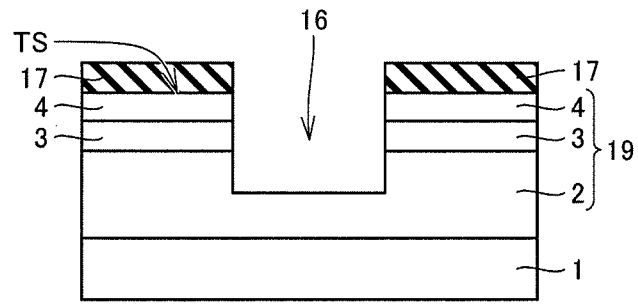
FIG. 7 is a partial cross sectional view schematically showing a fourth step of the method for manufacturing the silicon carbide semiconductor device of FIG. 1.

As shown in FIG. 7, a recess 16 having side surfaces substantially perpendicular to main surface TS of silicon carbide layer 19 is formed. Specifically, using masks 17, portions of n type source contact layer 4, p type body layer 3, and breakdown voltage holding layer 2 are etched. Exemplary, usable etching is reactive ion etching (RIE) or ion milling. As the RIE, inductively coupled plasma (ICP) RIE can be used in particular. Specifically, for example, the ICP-RIE can be employed using, as a reactive gas, a $SF_6$ or a mixed gas of $SF_6$ and $O_2$.

Figure 8:
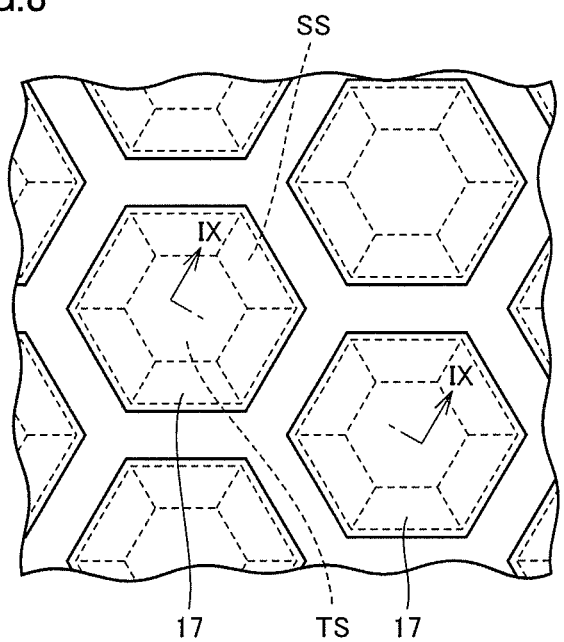
FIG. 8 is a partial plan view schematically showing a fifth step of the method for manufacturing the silicon carbide semiconductor device of FIG. 1.
Figure 9:
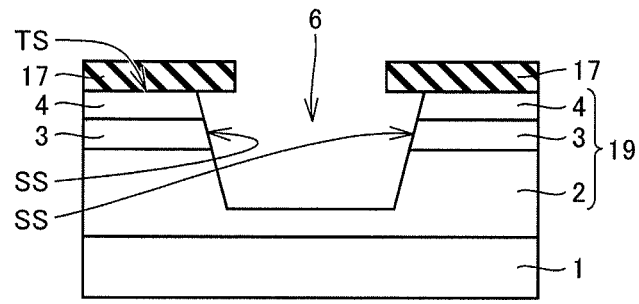
FIG. 9 is a partial cross sectional view schematically showing the fifth step of the method for manufacturing the silicon carbide semiconductor device of FIG. 1.

As shown in FIG. 8 and FIG. 9, trench 6 is formed to provide silicon carbide layer 19 with side surfaces SS inclined relative to main surface TS. Specifically, main surface TS of silicon carbide layer 19 on which masks 17 are formed is subjected to thermal etching. Here, the term "thermal etching" refers to etching that employs chemical reaction taking place by supplying a process gas containing a reactive gas to a heated object to be etched. In the present embodiment, chlorine-based gas, preferably chlorine gas is used as the reactive gas. Further, the thermal etching is preferably performed in an atmosphere in which the chlorine-based gas has a partial pressure of 50% or smaller. Further, the thermal etching is preferably performed in an atmosphere with reduced pressure. More preferably, the atmosphere with reduced pressure has a pressure of not more than 1/10 of the atmospheric pressure. Further, the thermal etching is preferably performed under a condition that substrate 1 having silicon carbide layer 19 provided thereon has a temperature (heat treatment temperature) of 1000° C. or greater.

The following describes an example of the thermal etching in detail.

Regarding the process gas, a mixed gas of oxygen gas and chlorine gas is used as a reactive gas. The etching is performed at a heat treatment temperature of, for example, not less than 700° C. and not more than 1200° C. Preferably, the heat treatment temperature is not less than 700° C. and not more than 1200° C. In the case where the heat treatment temperature is 1200° C. or smaller, a quartz member can be used for a device for the heat treatment. The upper limit of the temperature is more preferably 1100° C., further preferably 1000° C. The lower limit of the temperature is more preferably 800° C., further preferably 900° C. In this case, the etching rate can be a sufficiently practical value in the thermal etching step of forming the surface including the {0-33-8} plane, the {01-1-4} plane, or the {100} plane. Accordingly, the treatment time in this step can be sufficiently short.

Here, in the thermal etching step, main reaction proceeds under conditions that x and y satisfy $0.5 \leq x \leq 2.0$ and $1.0 \leq y \leq 2.0$ in a reaction formula represented as $SiC + mO_2 + nCl_2 \rightarrow SiCl_x + CO_y$, where m, n, x, and y are positive numbers. Under conditions that x=4 and y=2, the reaction (thermal etching) proceeds the most. It should be noted that m and n described above respectively represent amounts of the oxygen gas and the chlorine gas actually reacting, and are therefore different from amounts of the oxygen gas and the chlorine gas supplied as the process gas. The present inventors have found that a ratio of a flow rate of oxygen to a flow rate of chlorine in this thermal etching is preferably not less than 0.1 and not more than 2.0. More preferably, the lower limit of this ratio is 0.25. In this case, a surface including the {0-33-8} plane, the {01-1-4} plane, or the {100} plane can be securely formed.

It should be noted that the reaction gas may contain a carrier gas in addition to the chlorine gas and the oxygen gas. An exemplary, usable carrier gas is nitrogen ($N_2$) gas, argon gas, helium gas, or the like. When the heat treatment temperature is set at not less than 700° C. and not more than 1000° C. as described above, a rate of etching SiC is approximately, for example, 70 μm/hr. Further, when using silicon oxide ($SiO_2$) as mask 17 in this case, a selection ratio of SiC to $SiO_2$ can be very large. Accordingly, mask 17 made of $SiO_2$ is not substantially etched during etching of SiC.

It should be noted that in the case of the hexagonal system, the crystal plane, exhibited in side surface SS may be substantially the {0-33-8} plane. Namely, in the etching under the above-described conditions, side surface SS of trench 6 is spontaneously formed to correspond to the {0-33-8} plane, which is a crystal plane allowing for the slowest etching rate. As a result, a structure shown in FIG. 9 is obtained. It should be noted that the crystal plane constituting side surface SS may be the {01-1-4} plane. Meanwhile, in the case of the cubic system, the crystal plane constituting side surface SS may be the {100} plane.

Next, mask 17 (FIG. 8 and FIG. 9) is removed by means of an appropriate method such as etching.

Figure 10:
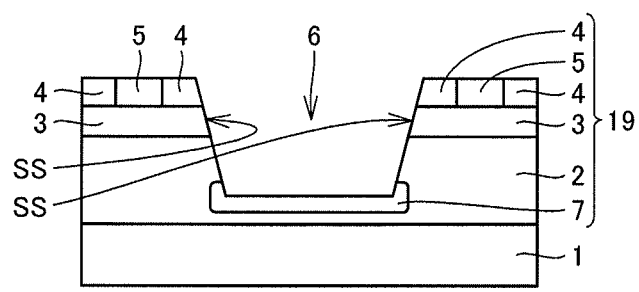
FIG. 10 is a partial cross sectional view schematically showing a sixth step of the method for manufacturing the silicon carbide semiconductor device of FIG. 1.
Figure 11:
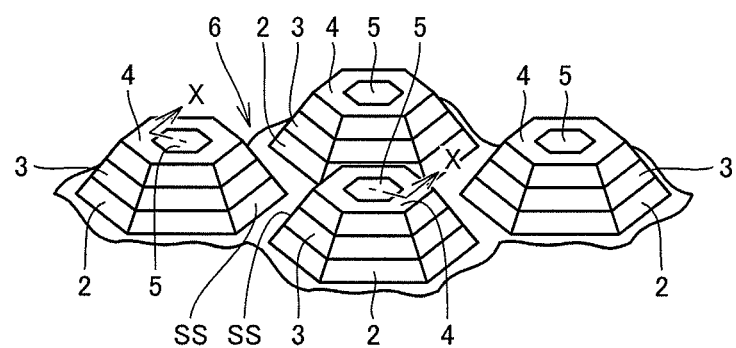
FIG. 11 is a partial perspective view schematically showing the sixth step of the method for manufacturing the silicon carbide semiconductor device of FIG. 1.

As shown in FIG. 10 and FIG. 11, contact regions 5 and electric field relaxing region 7 are formed. Specifically, a resist film (not shown) having a predetermined pattern is first formed using the photolithography method so as to extend from the inside of trench 6 onto each of the upper surfaces of n type source contact layers 4. As the resist film, there can be used a resist film having an opening pattern in conformity with the bottom portion of trench 6 and a portion of the upper surface of each of n type source contact layers 4. By implanting ions of an impurity for providing p type conductivity using this resist film as a mask, electric field relaxing region 7 is formed at the bottom portion of trench 6 and contact region 5 of p type conductivity is formed at the region of the portion of n type source contact layer 4. Thereafter, the resist film is removed.

As seen from FIG. 11, trench 6 has a planar shape in the form of a mesh constituted of unit cells (each defined by annular portion of trench 6 surrounding one mesa structure) each having a hexagonal planar shape. Further, p type contact region 5 is disposed substantially at the central portion of the upper surface of each of the mesa structures as shown in FIG. 11. Further, p type contact region 5 has a planar shape similar to the shape of outer circumference of the upper surface of the mesa structure, i.e., has a hexagonal planar shape.

Next, an activation annealing step is performed to activate the impurity implanted by means of the above-described ion implantation. In this activation annealing step, the annealing treatment is performed without forming any particular cap layer on the surface of the epitaxial layer made of silicon carbide (for example, on the side wall of the mesa structure). Here, the inventors have found that even when the activation annealing treatment is performed without forming a protecting film such as the cap layer on the surface thereof in the case where the above-described {0-33-8} plane is employed, a property of the surface is never deteriorated and sufficient surface smoothness can be maintained. Thus, the conventionally required step of forming the protecting film (cap layer) before the activation annealing treatment is omitted and the activation annealing step is directly performed. It should be noted that the above-described cap layer may be formed before performing the activation annealing step. Alternatively, for example, the cap layer may be provided only on the upper surfaces of n type source contact layer 4 and p type contact region 5 before performing the activation annealing treatment.

Figure 12:
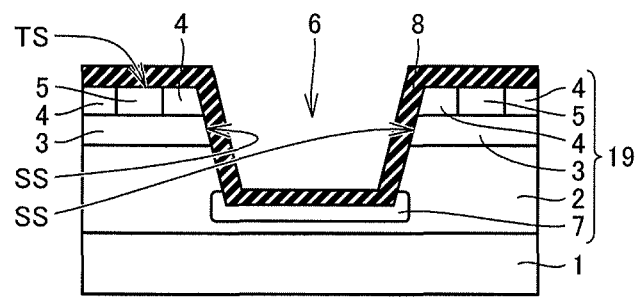
FIG. 12 is a partial cross sectional view schematically showing a seventh step of the method for manufacturing the silicon carbide semiconductor device of FIG. 1.

As shown in FIG. 12, gate insulating film 8 is formed on side surfaces SS of silicon carbide layer 19. Specifically, gate insulating film 8 is formed to extend from the inside of trench 6 onto the upper surfaces of n type source contact layer 4 and p type contact region 5. As gate insulating film 8, for example, there can be used an oxide film (silicon oxide film) obtained by thermally oxidizing silicon carbide layer 19.

Figure 13:
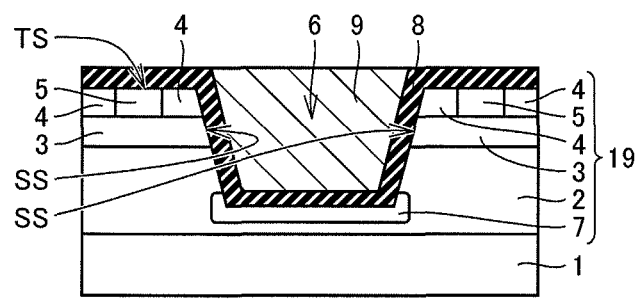
FIG. 13 is a partial cross sectional view schematically showing an eight step of the method for manufacturing the silicon carbide semiconductor device of FIG. 1.

As shown in FIG. 13, gate electrode 9 is formed to face each of side surfaces SS of silicon carbide layer 19 with gate insulating film 8 being interposed therebetween. Specifically, gate electrode 9 is formed on gate insulating film 8 to fill the inside of trench 6. As a method for forming gate electrode 9, the following method can be used, for example. First, a sputtering method or the like is employed to form a conductor film on gate insulating film 8. The conductor film is to be the gate electrode extending to the inside of trench 6 and to a region on p type contact region 5. The conductor film can be made of any material such as a metal as long as the material has conductivity. Thereafter, an appropriate method such as an etch back method or a CMP (Chemical Mechanical Polishing) method is used to remove a portion of the conductor film formed on regions other than the inside of trench 6. As a result, the conductor film filling the inside of trench 6 remains to constitute gate electrode 9.

Figure 14:
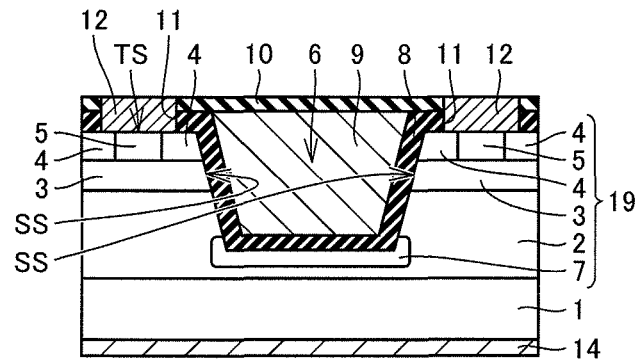
FIG. 14 is a partial cross sectional view schematically showing a ninth step of the method for manufacturing the silicon carbide semiconductor device of FIG. 1.

Referring to FIG. 14, interlayer insulating film 10 is formed to cover the upper surface of gate electrode 9 and the upper surface of gate insulating film 8 exposed on p type contact region 5. Interlayer insulating film 10 can be made of any material as long as the material is insulative. Further, a resist film (not shown) having a pattern is formed on interlayer insulating film 10, using the photolithography method. The resist film is provided with an opening pattern formed in conformity with a region on p type contact region 5. Using this resist film as a mask, portions of interlayer insulating film 10 and gate insulating film 8 are removed by means of etching. As a result, openings 11 (see FIG. 14) are formed to extend through interlayer insulating film 10 and gate insulating film 8. Each of openings 11 has a bottom portion at which p type contact region 5 and a portion of n type source contact layer 4 are exposed.

Thereafter, a conductor film is formed to fill the inside of opening 11 and cover the upper surface of the above-described resist film. Thereafter, the resist film is removed using a chemical solution or the like, thereby simultaneously removing (lifting off) the portion of the conductor film formed on the resist film. As a result, the conductor film filling the inside of opening 11 constitutes source electrode 12. This source electrode 12 is an ohmic electrode making ohmic contact with p type contact region 5 and n type source contact layer 4.

Further, drain electrode 14 is formed on the backside surface of substrate 1 (the surface thereof opposite to the main surface thereof on which breakdown voltage holding layer 2 is formed). Drain electrode 14 can be made of any material as long as the material allows for ohmic contact with substrate 1.

Referring to FIG. 1 again, an appropriate method such as the sputtering method is employed to form source wire electrode 13 and backside surface protecting electrode 15. Source wire electrode 13 makes contact with the upper surface of source electrode 12, and extends on the upper surface of interlayer insulating film 10. Backside surface protecting electrode 15 is formed on the surface of drain electrode 14. As a result, MOSFET 101 is obtained.

According to the present embodiment, the thermal etching is performed in the atmosphere in which the chlorine-based gas has a partial pressure of 50% or smaller. Accordingly, an amount of the chlorine-based gas supplied to the surface to be etched is restricted. As a result, progress of etching is suppressed at the portion having high chemical stability, and etching of the portion having low chemical stability mainly proceeds. Accordingly, the plane orientation of side surface SS formed in silicon carbide layer 19 by means of etching can be made closer to the specific crystal plane.

Further, the thermal etching is performed in the atmosphere with reduced pressure. Accordingly, the amount of the chlorine-based gas supplied to the surface to be etched is restricted. As a result, progress of etching is suppressed at the portion having high chemical stability, and etching mainly proceeds at the portion having low chemical stability. Accordingly, the plane orientation of side surface SS formed in silicon carbide layer 19 by means of etching can be made closer to the specific crystal plane. Preferably, the atmosphere with reduced pressure has a pressure of not more than 1/10 of the atmospheric pressure. Accordingly, the amount of chlorine-based gas supplied to the surface to be etched is sufficiently restricted.

Further, the thermal etching is performed at 1000° C. or greater. Accordingly, the surface to be etched is chemically activated, whereby an amount of consumption of chlorine-based gas in the etching becomes large at this surface. Hence, the amount of chlorine-based gas having an etching ability is restricted on the surface to be etched. As a result, progress of etching is suppressed at the portion having high chemical stability, and etching of the portion having low chemical stability mainly proceeds. Accordingly, the plane orientation of side surface SS formed in silicon carbide layer 19 by means of etching can be made closer to the specific crystal plane.

Further, gate insulating film 8 is formed on side surface SS of silicon carbide layer 19, and gate electrode 9 is formed to face side surface SS of silicon carbide layer 19 with gate insulating film 8 being interposed therebetween. In this way, side surface SS having a plane orientation closer to the specific crystal plane can be used as the channel surface controlled by gate electrode 9. Accordingly, variation of channel mobility can be suppressed. When the specific crystal plane is adapted to attain high channel mobility, high channel mobility can be obtained stably.

Figure 15:
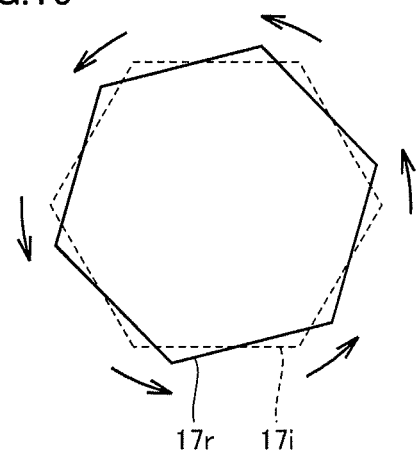
FIG. 15 is a plan view for illustrating deviation of rotation of a mask.

The following describes occurrence of deviation of rotation of mask 17 (FIG. 5) with reference to FIG. 15. When silicon carbide layer 19 (FIG. 6) is of hexagonal system, mask 17 is suitably shaped to be hexagonal. This hexagonal arrangement might be deviated from an ideal arrangement 17$i$ to an arrangement 17$r$ as indicated by arrows in the figure. In this case, if the conditions of the thermal etching in the present embodiment are used, a desired side surface SS can be obtained irrespective of some deviation because the specific crystal plane is highly likely to spontaneously formed.

Figure 16:
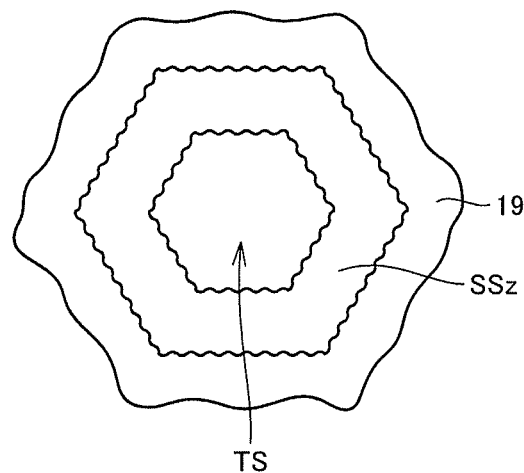
FIG. 16 is a partial plan view schematically showing the shape of a side surface of a silicon carbide layer in a comparative example.
Figure 17:
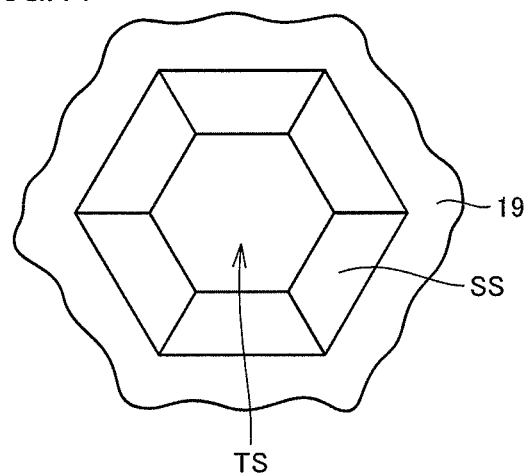
FIG. 17 is a partial plan view schematically showing the shape of the side surface of the silicon carbide layer in the present embodiment.
Figure 18:
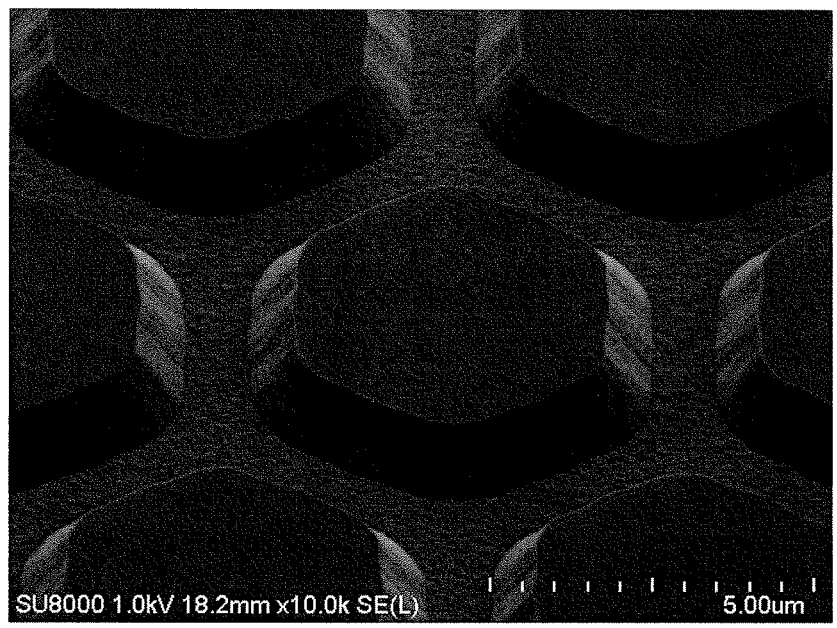
FIG. 18 is a microphotograph of the silicon carbide layer in the comparative example.
Figure 19:
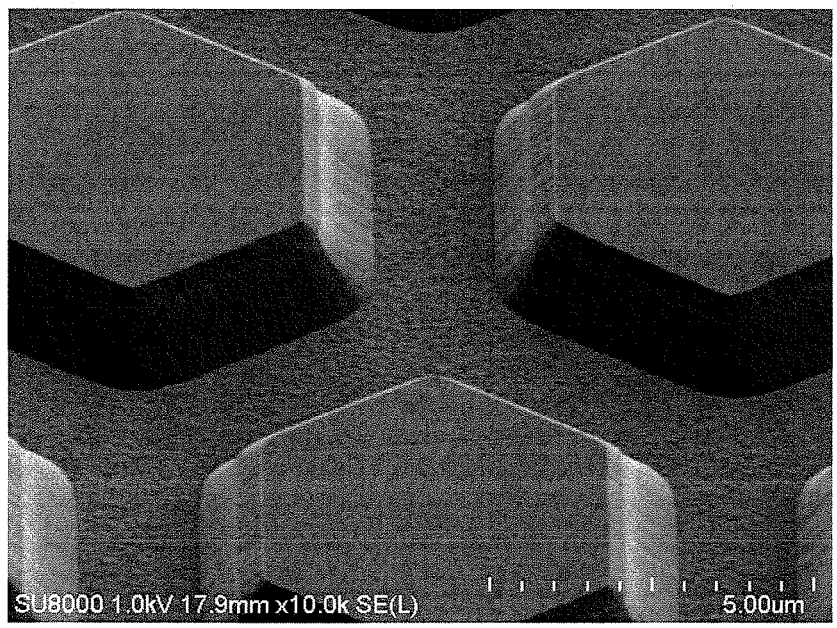
FIG. 19 is a microphotograph of the silicon carbide layer in the example.

The following describes the shape of side surface SS. In the case of employing inappropriate thermal etching conditions under which not only the portion having low chemical stability but also the portion having high chemical stability are noticeably etched (in the case of a comparative example), side surfaces SSz less straight are likely to be formed when viewed in a plan view as shown in FIG. 16. In contrast, according to the present embodiment, the specific crystal plane is spontaneously formed, thus forming side surfaces SS more straight when viewed in a plan view as shown in FIG. 17. FIG. 18 and FIG. 19 respectively show microphotographs of the silicon carbide layers of the comparative example and the example.

Figure 20:
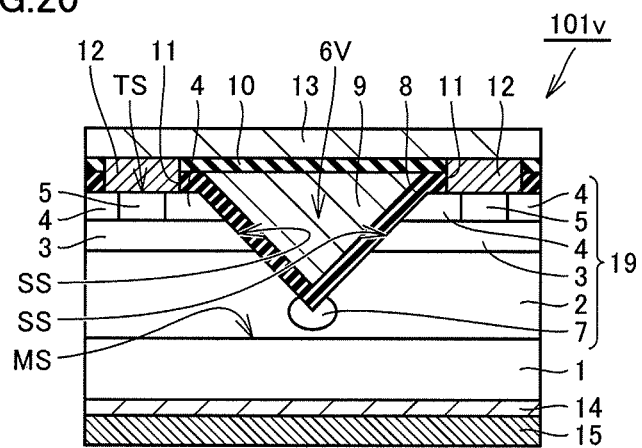
FIG. 20 is a partial cross sectional view schematically showing a variation of FIG. 1.

It should be noted that although trench 6 of MOSFET 101 has the flat bottom surface, a V-shaped trench may be provided such as a trench 6V (FIG. 20) of a MOSFET 101$v$. In this case, MOSFETs can be integrated more.

(Second Embodiment)

Figure 21:
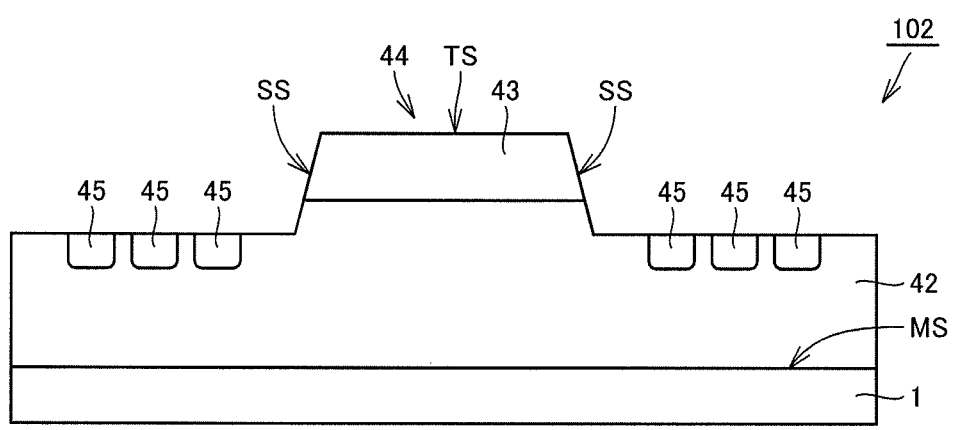
FIG. 21 is a partial cross sectional view schematically showing a configuration of a silicon carbide semiconductor device in a second embodiment of the present invention.

As shown in FIG. 21, a PiN diode 102 serving as a silicon carbide semiconductor device of the present embodiment includes a substrate 1, and a silicon carbide layer having an n⁻ epitaxial layer 42 and a p⁺ semiconductor layer 43. Substrate 1 has n type conductivity. N⁻ epitaxial layer 42 has n type conductivity, and has an impurity concentration lower than the concentration of a conductive impurity of substrate 1. P⁺ semiconductor layer 43 is provided on n epitaxial layer 42. The silicon carbide layer is provided with a mesa structure 44 having a main surface TS serving as a top surface, and side surfaces SS. The silicon carbide layer has a surface constituted of n⁻ epitaxial layer 42 so as to surround this mesa structure 44. On this surface, guard rings 45 are provided. Each of guard rings 45 has p type conductivity.

Each of side surfaces SS is constituted by a specific crystal plane (for example, a {03-3-8} plane). Namely, mesa structure 44 has six planes equivalent to the specific crystal plane ({03-3-8} plane).

PiN diode 102 has a current path extending between main surface TS of the silicon carbide layer and substrate 1 in the thickness direction of the silicon carbide layer (vertical direction in the figure). In this case, side surfaces SS are located between the main surface TS side and the substrate 1 side corresponding to ends of PiN diode 102. Hence, leakage current, which flows via the surface of the silicon carbide layer, flows on side surfaces SS. When each of side surfaces SS is adapted to have a plane orientation close to the specific crystal plane as described above, current is stably suppressed and is less likely to flow on side surfaces SS. Accordingly, leakage current of diode 102 can be stably suppressed to a low value. Further, when the specific crystal plane is adapted to attain a low interface state density, leakage current can be suppressed stably.

The following describes a method for manufacturing PiN diode 102. Substrate 1 is prepared. As substrate 1, for example, there can be used a substrate made of silicon carbide of hexagonal crystal type. N⁻ epitaxial layer 42 is formed on the main surface of substrate 1 using an epitaxy method. Into the front side of n⁻ epitaxial layer 42, ions of an impurity for providing p type conductivity are implanted, thereby forming a p type semiconductor layer, which is to be p⁺ semiconductor layer 43.

Thereafter, on a region to serve as mesa structure 44, a mask pattern made of a silicon oxide film and in the form of an island is formed. This mask pattern may be adapted to have, for example, a hexagonal planar shape, but may have any other shape (such as a round shape or a quadrangular shape). With this mask pattern formed, portions of p⁺ semiconductor layer 43 and n⁻ epitaxial layer 42 are removed by means of etching. As a result, a projection portion to serve as mesa structure 44 is formed below the mask pattern (corresponding to FIG. 7 of the first embodiment).

Next, thermal etching similar to that in the first embodiment is performed to, etch the side surfaces of the projection portion, thereby forming side surfaces SS. Thereafter, the mask pattern is removed. Next, guard rings 45 are formed by means of ion implantation. Next, activation annealing treatment is performed. In the activation annealing treatment, the heating treatment may be performed without forming a cap layer that at least covers side surfaces SS.

In this way, PiN diode 102 is obtained.

Figure 22:
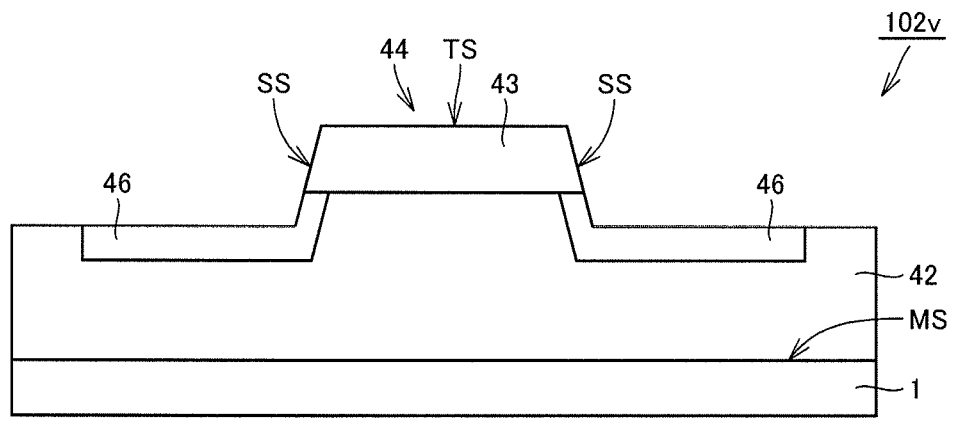
FIG. 22 is a partial cross sectional view schematically showing a variation of FIG. 21.

It should be noted that as shown in FIG. 22, a PiN diode 102$v$ may be used which is provided with JTE (Junction Termination Extension) regions 46. Each of JTE regions 46 has p type conductivity, and is disposed on n⁻ epitaxial layer 42 so as to be connected to p⁺ semiconductor layer 43.

It should be noted that in the present specification, the case where side surface SS includes one of the {03-3-8} plane, the {01-1-4} plane, and the {100} plane is intended to encompass a case where there are a plurality of crystal planes constituting side surface SS and the plurality of crystal planes include one of the {03-3-8} plane, the {01-1-4} plane, and the {100} plane. This will be specifically described and illustrated with reference to the case where side surface SS includes the {03-3-8} plane and another plane.

Figure 23:
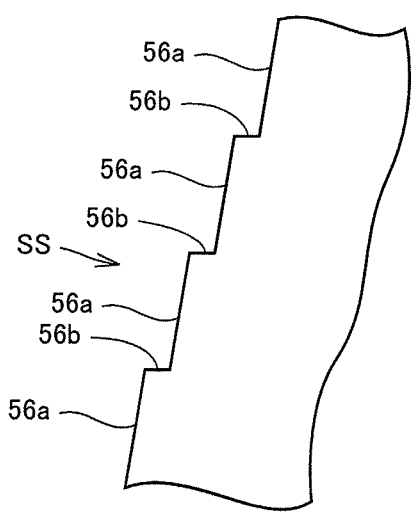
FIG. 23 is a partial cross sectional view schematically showing one example of the side surface of the silicon carbide layer.

Each of side surfaces SS may correspond to a chemically stable plane constituted by, for example, alternately providing a plane 56$a$ and a plane 56$b$ in the side surface of trench 6 as shown in FIG. 23, microscopically. Plane 56$a$ has a plane orientation of {0-33-8} whereas plane 56$b$, which is connected to plane 56$a$, has a plane orientation different from that of plane 56$a$. Here, the term "microscopically" refers to "minutely to such an extent that at least the size about twice as large as an interatomic spacing is considered". Preferably, plane 56$b$ has a plane orientation of {0-11-1}. Further, plane 56$b$ in FIG. 23 may have a length (width) twice as large as, for example, the interatomic spacing of Si atoms (or C atoms).

It should be noted that the MOSFET and the PiN diode have been described in detail above, but the silicon carbide semiconductor device is not limited to these, and may be, for example, an IGBT (Insulated Gate Bipolar Transistor). It should be also noted that a configuration may be employed in which n type conductivity and p type conductivity in each of the above-described configurations are replaced with each other.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A method for manufacturing a silicon carbide semiconductor device, comprising the steps of:
   forming a silicon carbide layer on a substrate, said silicon carbide layer being provided with a main surface;
   forming a mask covering a portion of said main surface of said silicon carbide layer;
   forming a recess by etching said silicon carbide layer by means of a reactive ion etching or an ion milling using said mask; and
   thermally etching a side surface of said recess using said mask and chlorine-based gas at a temperature of not less than 700 degrees Celsius and not more than 1200 degrees Celsius in an atmosphere with reduced pressure in which said chlorine-based gas has a partial pressure of 50% or less so as to incline said side surface of said recess relative to said main surface,
   wherein said atmosphere with reduced pressure has a pressure of not more than 1/10 of an atmospheric pressure.

2. The method for manufacturing the silicon carbide semiconductor device according to claim 1, wherein the step of thermally etching is performed at 1000° C. or greater.

3. The method for manufacturing the silicon carbide semiconductor device according to claim 1, further comprising the steps of:
   forming a gate insulating film on said side surface of said silicon carbide layer; and
   forming a gate electrode facing said side surface of said silicon carbide layer with said gate insulating film being interposed therebetween.

4. The method for manufacturing the silicon carbide semiconductor device according to claim 1, wherein said silicon carbide semiconductor device is a diode having a current path extending between said main surface of said silicon carbide layer and said substrate in a thickness direction of said silicon carbide layer.

5. A method for manufacturing a silicon carbide semiconductor device, comprising the steps of:
   forming a silicon carbide layer on a substrate, said silicon carbide layer being provided with a main surface;
   forming a mask covering a portion of said main surface of said silicon carbide layer;
   forming a recess by etching said silicon carbide layer by means of a reactive ion etching or an ion milling using said mask; and
   thermally etching a side surface of said recess using said mask and chlorine-based gas at a temperature of not less than 700 degrees Celsius and not more than 1200 degrees Celsius in an atmosphere with reduced pressure so as to form an inclined surface including a {0-33-8} plane at said side surface of said recess,
   wherein said atmosphere with reduced pressure has a pressure of not more than 1/10 of an atmospheric pressure, and
   wherein the step of thermally etching is performed in an atmosphere in which said chlorine-based gas has a partial pressure of 50% or smaller.

6. The method for manufacturing the silicon carbide semiconductor device according to claim 5, wherein the step of thermally etching is performed at 1000° C. or greater.

7. The method for manufacturing the silicon carbide semiconductor device according to claim 5, further comprising the steps of:
   forming a gate insulating film on said side surface of said silicon carbide layer; and
   forming a gate electrode facing said side surface of said silicon carbide layer with said gate insulating film being interposed therebetween.

8. The method for manufacturing the silicon carbide semiconductor device according to claim 5, wherein said silicon carbide semiconductor device is a diode having a current path extending between said main surface of said silicon carbide layer and said substrate in a thickness direction of said silicon carbide layer.

9. A method for manufacturing a silicon carbide semiconductor device, comprising the steps of:
   forming a silicon carbide layer on a substrate, said silicon carbide layer being provided with a main surface;
   forming a mask covering a portion of said main surface of said silicon carbide layer;
   thermally etching said main surface of said silicon carbide layer on which said mask is formed, using chlorine-based gas so as to provide said silicon carbide layer with a side surface inclined relative to said main surface, the step of thermally etching being performed at 1000° C. or greater;
   forming a gate insulating film on said side surface of said silicon carbide layer; and
   forming a gate electrode facing said side surface of said silicon carbide layer with said gate insulating film being interposed therebetween,
   wherein the step of thermally etching is performed in an atmosphere with reduced pressure,
   wherein said atmosphere with reduced pressure has a pressure of not more than 1/10 of an atmospheric pressure, and
   wherein the step of thermally etching is performed in an atmosphere in which said chlorine-based gas has a partial pressure of 50% or smaller.

10. The method for manufacturing the silicon carbide semiconductor device according to claim 9, wherein said silicon carbide semiconductor device is a diode having a current path extending between said main surface of said silicon carbide layer and said substrate in a thickness direction of said silicon carbide layer.

* * * * *